(12) United States Patent
Shen et al.

(10) Patent No.: US 10,971,423 B2
(45) Date of Patent: Apr. 6, 2021

(54) METAL NANOWIRE BASED THERMAL INTERFACE MATERIALS

(71) Applicant: Carnegie Mellon University, Pittsburgh, PA (US)

(72) Inventors: Sheng Shen, Pittsburgh, PA (US); Wei Gong, Pittsburgh, PA (US); Pengfei Li, Shen Zhen (CN)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 35 days.

(21) Appl. No.: 16/436,167

(22) Filed: Jun. 10, 2019

(65) Prior Publication Data

US 2019/0378778 A1 Dec. 12, 2019

Related U.S. Application Data

(60) Provisional application No. 62/763,297, filed on Jun. 8, 2018.

(51) Int. Cl.
*H01L 23/00* (2006.01)
*H01L 23/373* (2006.01)
*H01L 23/367* (2006.01)
*C09K 5/14* (2006.01)

(52) U.S. Cl.
CPC ............ *H01L 23/3733* (2013.01); *C09K 5/14* (2013.01); *H01L 23/3677* (2013.01); *F28F 2255/20* (2013.01)

(58) Field of Classification Search
CPC .... C09K 5/14; F28F 2255/20; H01L 23/3677; H01L 23/3733; H01L 23/3736; H01L 23/42

USPC .......................................................... 252/71
See application file for complete search history.

(56) References Cited

U.S. PATENT DOCUMENTS

| 9,601,452 | B2 * | 3/2017 | Starkovich | ........... C25D 7/0607 |
| 9,711,407 | B2 * | 7/2017 | Or-Bach | ............... H01L 23/544 |
| 2016/0251769 | A1 * | 9/2016 | Silverman | ........... H01L 23/3736 428/601 |
| 2017/0040296 | A1 * | 2/2017 | Das | ................... H01L 23/53238 |
| 2017/0146302 | A1 * | 5/2017 | Starkovich | ............... C25D 5/48 |
| 2018/0155824 | A1 * | 6/2018 | Berg | ................. H01L 23/53276 |

OTHER PUBLICATIONS

Michael T. Barako et al., "Thermal Conduction in Vertically Aligned Copper Nanowire Arrays and Composites", ACS Appl. Mater. Interfaces, 2015, 7, 19251-19259. (Year: 2015).*
Michael T. Barako et al., "Dense Vertically Aligned Copper Nanowire Composites as High Performance Thermal Interface Materials ", ACS Applied Materials & Interfaces, 2017, 9, 42067-42074. (Year: 2017).*

* cited by examiner

*Primary Examiner* — Douglas J Mc Ginty
(74) *Attorney, Agent, or Firm* — Kacvinsky Daisak Bluni PLLC

(57) ABSTRACT

A high-performance thermal interface material comprising a heterogeneous copper-tin nanowire array that is ultra-compliant and that can reduce thermal resistance by two times as compared with the state-of-the-art thermal interface materials. The high-performance thermal interface material can be further used in electronic systems, ranging from microelectronics to portable electronics to massive data centers, to operate at lower temperatures, or at the same temperature but with higher performance and higher power density.

15 Claims, 7 Drawing Sheets

(A)

(B)

(A)

(B)

(A)

(B)

METAL NANOWIRE BASED THERMAL INTERFACE MATERIALS

RELATED APPLICATIONS

This application claims the benefit of U.S. Provisional Patent Application No. 62/763,297, filed Jun. 8, 2018, which is hereby incorporated herein in its entirety.

GOVERNMENT RIGHTS

This invention was made with Government support under contract D14AP00008, awarded by the U.S. Department of the Interior. The Government has certain rights in this invention.

BACKGROUND OF THE INVENTION

Continually increasing power dissipation has become a dominant limiting factor for the performance of modem electronics, such as computer chips, solid state lasers, high-power electronics, and LED modules. Consequently, highly effective, compact, and reliable heat removal solutions are generally required for various electronics, particularly in pursuit of concurrent size reduction and operating speed increase. Such thermal challenges are negatively impacting numerous areas from microelectronics, portable electronics and wearable devices to massive data centers. For instance, as the power density dissipated by logic chips reaches 100 W/cm$^2$, the scaling of microelectronics, such as complementary metal-oxide-semiconductor (CMOS) transistors has entered a phase of "power-constrained scaling" in which power density cannot increase further without substantially improved cooling technologies.

On the other hand, due to the dramatic increase in power density, the thermal resistance of interfaces has been widely identified as a bottleneck in the thermal management of electronics, where it can constitute more than 50% of the total thermal resistance from device to cooling fluid. To resolve this critical thermal issue, a TIM that thermally bridges two surfaces must simultaneously possess high thermal conductivity for significantly reducing thermal resistance, and high mechanical compliance for accommodating the thermal stress generated due to mismatch in coefficients of thermal expansion between two joined layers that can induce fatigue of materials, and even cause delamination and device failure.

Existing TIMs such as solders, greases, gels, and epoxies cannot provide the required thermal and mechanical multi-functionality. Solder TIMs usually have high thermal conductivity but very poor mechanical compliance, due to their stiff nature. Polymer-based TIMs offer high compliance but low thermal conductivity, on the order of 1 W/m·K. Large-scale nanostructures including nanowires, nanotubes, nanofibers, and their composites, have emerged as promising materials for TIM applications. Among them, vertically aligned carbon nanotube (CNT) arrays have generated significant interest because of the high mechanical compliance and the high intrinsic thermal conductivity of CNTs. Nevertheless, the relatively large thermal contact resistance when using CNTs severely limits their potential as TIMs because most CNTs do not have the same height due to non-uniform growth, and their ends are highly entangled.

While the copper nanowires grown from polycarbonate membranes have been measured to have a thermal conductivity as high as 70 W/m·K, their mechanical compliance and reliability under thermal cycling still remain unknown because of the crosslinks between the nanowires. A compliant polymer TIM was developed using arrays of polythiophene nanofibers in which individual nanofibers have a moderate thermal conductivity up to 4.4 W/m·K.

SUMMARY OF THE INVENTION

Disclosed herein is a high-performance thermal interface material (HPTIM) comprising a heterogeneous copper-tin nanowire array that is ultra-compliant, exhibiting a Young's modulus 2-3 orders of magnitude lower, and a shear modulus 3-4 orders of magnitude lower than traditional solders, and which is capable of reducing the thermal resistance by two times as compared with the state-of-the-art TIMs.

The HPTIM also exhibits exceptional long-term reliability with >1,280 thermal cycles (corresponding to >640 hours) over a wide temperature range. By resolving the critical thermal bottleneck, the HPTIM enables electronic systems, ranging from microelectronics to portable electronics to massive data centers, to operate at lower temperatures, or at the same temperature but with higher performance and higher power density.

DETAILED DESCRIPTION

The thermal interface layer of the present invention comprises heterogeneous nanowires composed of segmented portions of copper and tin. The tin segment of each nanowire maintains excellent solderability and thermal contact with other surfaces, whereas the compliant and thermally conductive copper segment of the nanowire efficiently transfers heat and accommodates thermal stresses generated at interfaces.

In preferred embodiments, each nanowire is composed of a copper segment and a tin segment, with the copper segment comprising 60% to 80% of the overall height of the nanowire, with the remaining height of the nanowires comprising the tin segment. In preferred embodiments, the overall length of the nanowires is between about 10 µm and 100 µm. Note that the larger lengths of nanowires result in a more mechanically compliant HPTIM, while shorter lengths result in a less mechanically compliant HPTIM. To minimize thermal resistance, the nanowire height needs to be as small as possible, however, with shorter nanowires, the material becomes stiffer.

In preferred embodiments, the filling ratio of the nanowires will be between 15% to 75% of the overall surface area of the substrates being bonded, with an optimal density of about 50%. There is a trade-off between thermal conductivity and mechanical compliance as a function of density. Less dense HPTIMs will be more mechanically compliant but less thermally conductive, while denser HPTIMs will be less mechanically compliant but more thermally conductive. Additionally, the aspect ratio of the nanowires (i.e., the ratio of the height to the diameter) should be in the range of 100-1000. A higher aspect ratio corresponds to a higher mechanical compliance.

In preferred embodiments, the measured elastic and shear moduli of copper nanowires are in the ranges of 200 MPa to 1.5 GPa, and 2 MPa to 15 MPa, respectively, which are 2-3 orders of magnitude smaller than the bulk values of copper. The HPTIM also exhibits an extremely low thermal resistance of ~0.5 mm$^2$·KW in a fully bonded configuration, which is about 2 times smaller than the state-of-the-art TIMs. More importantly, thermal cycling tests over a wide temperature range show that the HPTIM can stably work for >1,280 cycles, thus unambiguously demonstrating its long-term reliability.

Figure 2:
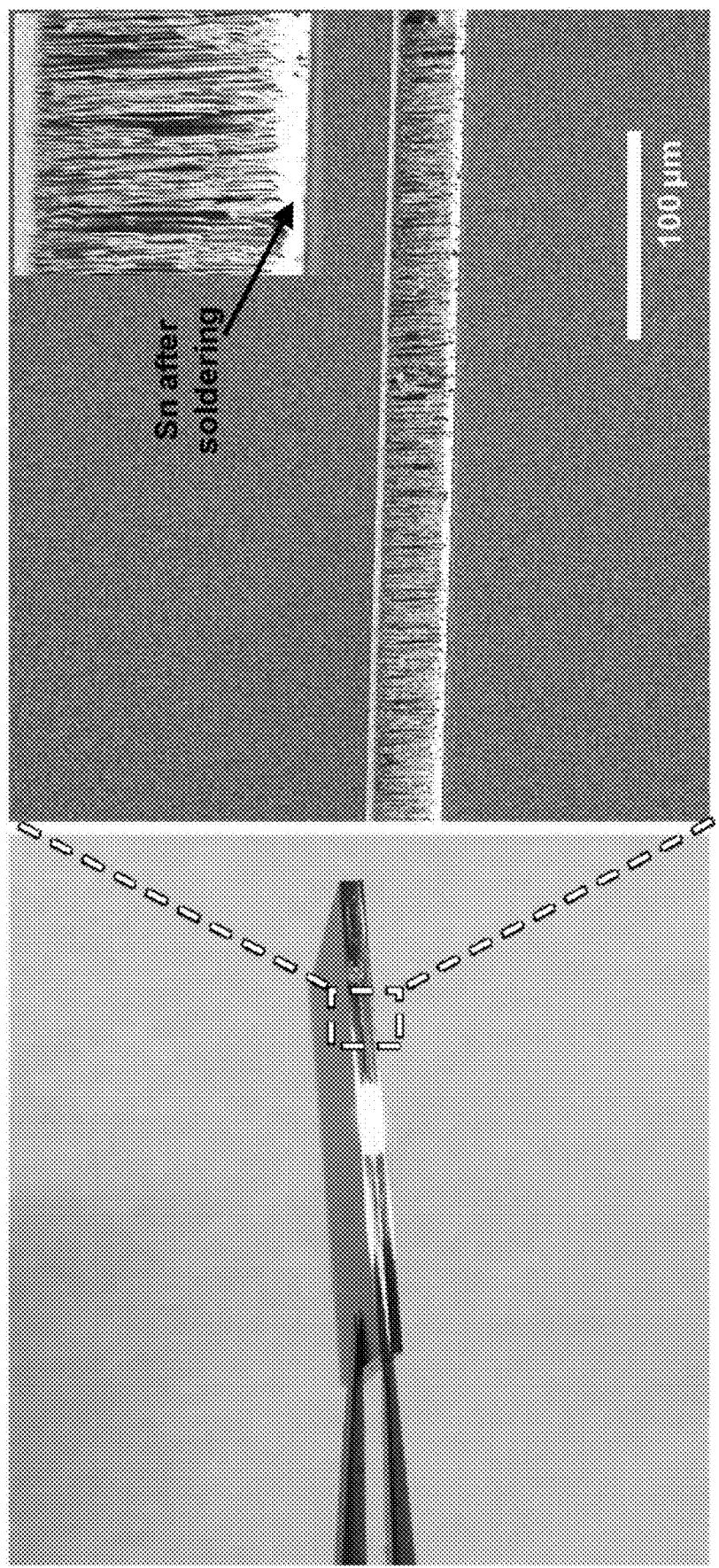
FIG. 2, view (A) is a photo of two silicon substrates bonded by the HPTIM, with a SEM image of a portion of view (A) shown in view (B) showing a cross section of the bonded assembly. The inset of view (B) shows a zoomed-in image of the continuous tin layer formed by tin nanowires after soldering.

The polymer-like compliance of the HPTIM originates from the high aspect ratio of the nanowires. In FIG. 2, vertically aligned heterogeneous copper-tin nanowires can be grown on a broad range of substrates, such as metals, dielectrics and semiconductors. Similar to conventional solders, the copper-tin nanowire arrays can be used to bond a variety of materials, as in the example shown in FIG. 2 showing the bonding of two silicon substrates. The height of the tin nanowire segment is typically 5-10 µm. By applying a well-controlled compression force when soldering, tin nanowire segments turn to micron-sized tin particles and merge into a continuous layer bonded with the copper nanowire segments, as shown in the inset of view (B) of FIG. 2.

Figure 3:
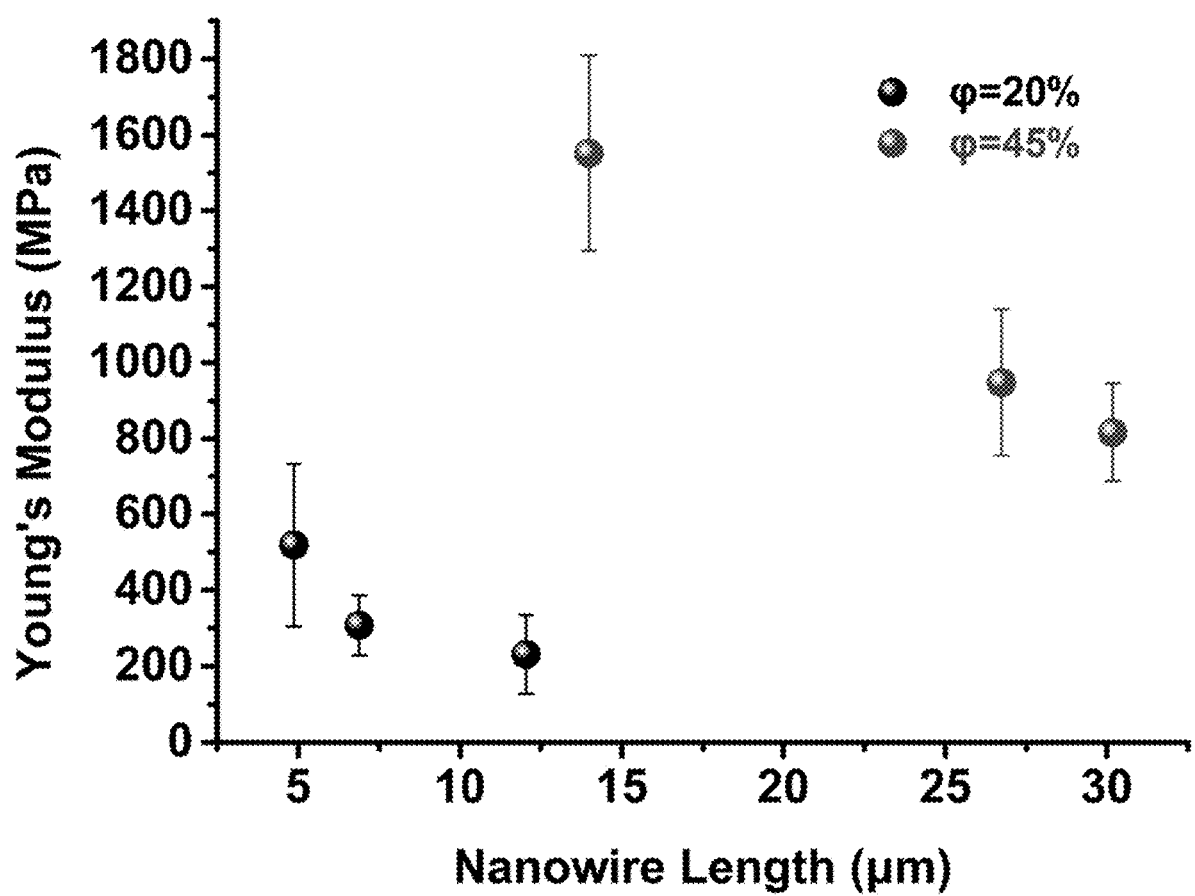
FIG. 3 is a graph showing the Young's modulus of the HPTIM as a function of nanowire length and filling ratio.

In one embodiment, the copper segments of the nanowires, which are suspended between the two substrates after soldering, as shown in FIG. 2, view (B), undergo both compressive and shear stresses induced by temperature fluctuations. The elastic and shear moduli of copper nanowires can be characterized with two filling ratios φ of ~20% and ~45%. The Young's moduli of the samples are measured by quasi-static partial unload tests with a square-shaped punch probe, where, during each measurement, 20 cycles of load/unload tests are applied, or, alternatively, load/unload cycles are applied until buckling of nanowires occurs. The Young's modulus of the copper nanowire arrays is calculated from the well-known Oliver-Pharr model based on the measured force-displacement curves. The Young's modulus increases with the normal force in the early stage of the tests because of the non-parallelism between the probe and the sample surfaces, which results in fewer nanowires in contact with the probe at the beginning. For larger normal forces when the indentation goes deeper, the Young's modulus reaches a plateau, which represents the overall response from the nanowire arrays and therefore the ultimate Young's modulus of the sample. In FIG. 3, for the samples with φ=20%, the measured Young's modulus is within a range of 200-500 MPa, whereas for φ=45%, the range of Young's modulus is from 750 MPa to 1.5 GPa. The results show that the measured Young's moduli are 2 to 3 orders of magnitude smaller than that of bulk copper.

The shear moduli of the samples are measured by two-dimensional scratch tests using the same probe. By measuring the lateral force F as a function of the corresponding lateral displacement Δx, the shear modulus of the samples can be calculated by the equation:

$$G = \frac{Fl}{A\Delta x'} \quad (1)$$

where:
l is the length of the copper nanowires; and
A is the shearing area.

Figure 4:
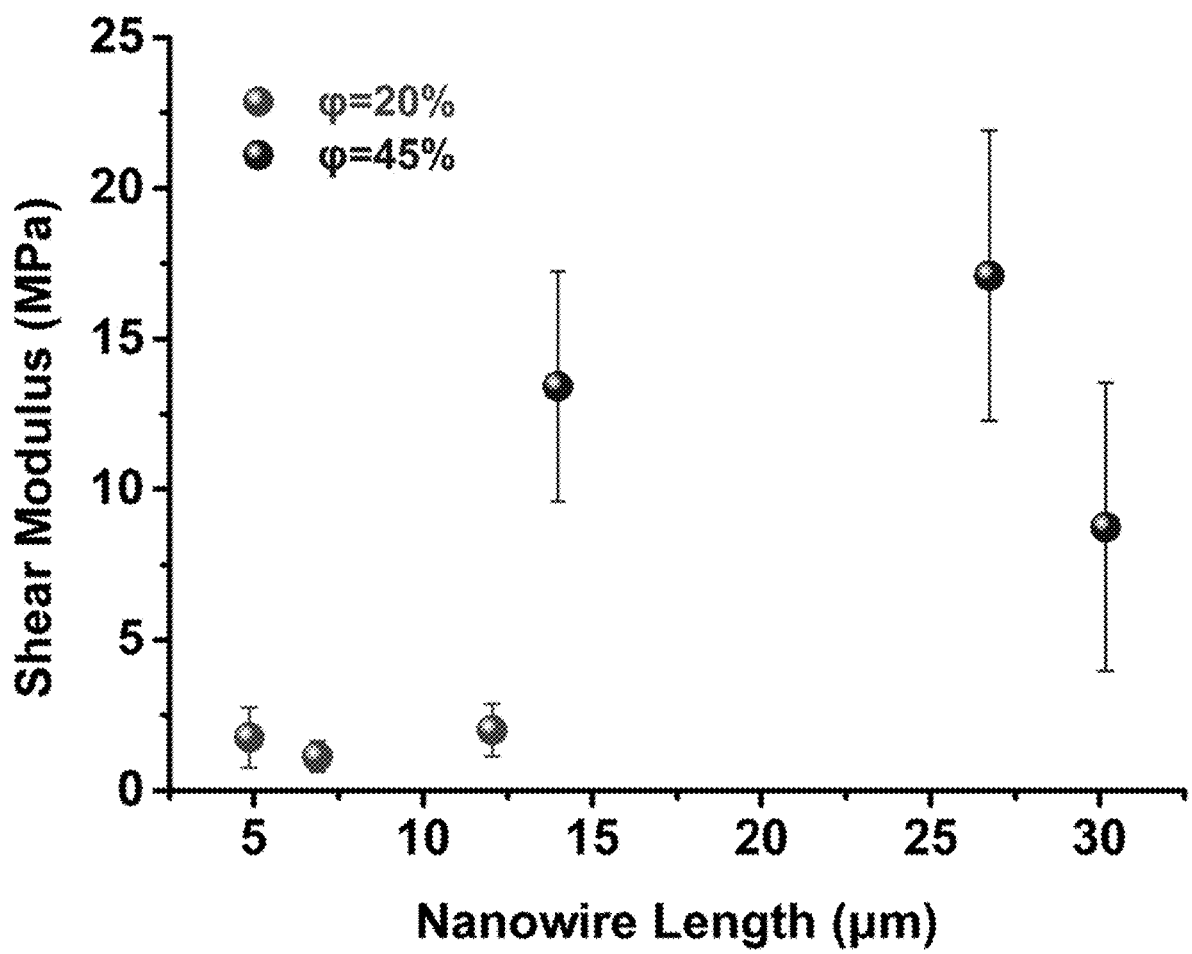
FIG. 4 is a graph of the shear modulus of the HPTIM as a function of nanowire length and filling ratio.

For all the samples, the measured lateral displacement of the nanowires is approximately linear with the applied lateral force. In FIG. 4, the measured shear modulus ranges from 8 MPa to 17 MPa for the samples with φ=45%. The shear modulus for the samples with φ=20% is extremely small, ranging from 1 MPa to 3 MPa, which is 4 orders of magnitude smaller than that of bulk copper. Experimental results demonstrate the high compliance of vertically aligned copper nanowire arrays. With a lower filling ratio (φ=20% versus φ=45%), the nanowires are more mechanically compliant. However, if the nanowires are too dense (e.g., φ>50%), their mechanical compliance is found to be dramatically reduced due to the mechanical interaction between nanowires. The measured Young's moduli generally decrease with the increase of nanowire heights, as shown in FIG. 3, due to the reduced aspect ratio of nanowires, but there is no obvious height dependence on shear modulus, as observed in FIG. 4, because the height influence on the measured shear moduli is offset when using equation (1) above.

Figure 5:
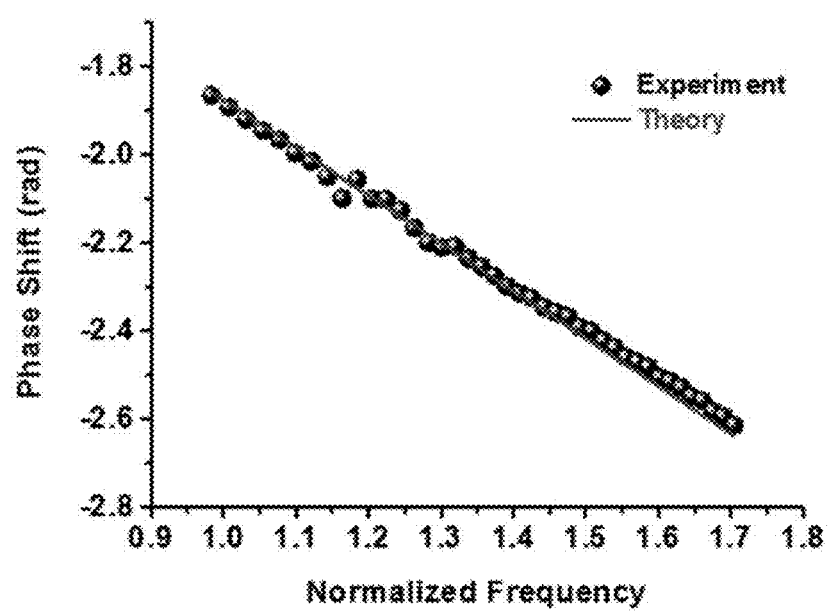
FIG. 5, view (A) is a graph of phase shift versus normalized frequency in a thermal cycling test. View (B) is a graph of the temperature history of the top and the bottom surfaces of a bonded TIM assembly during the first 8 cycles of the test, in which one cycle takes 30 minutes divided equally for both the heating and the cooling periods.
Figure 5:
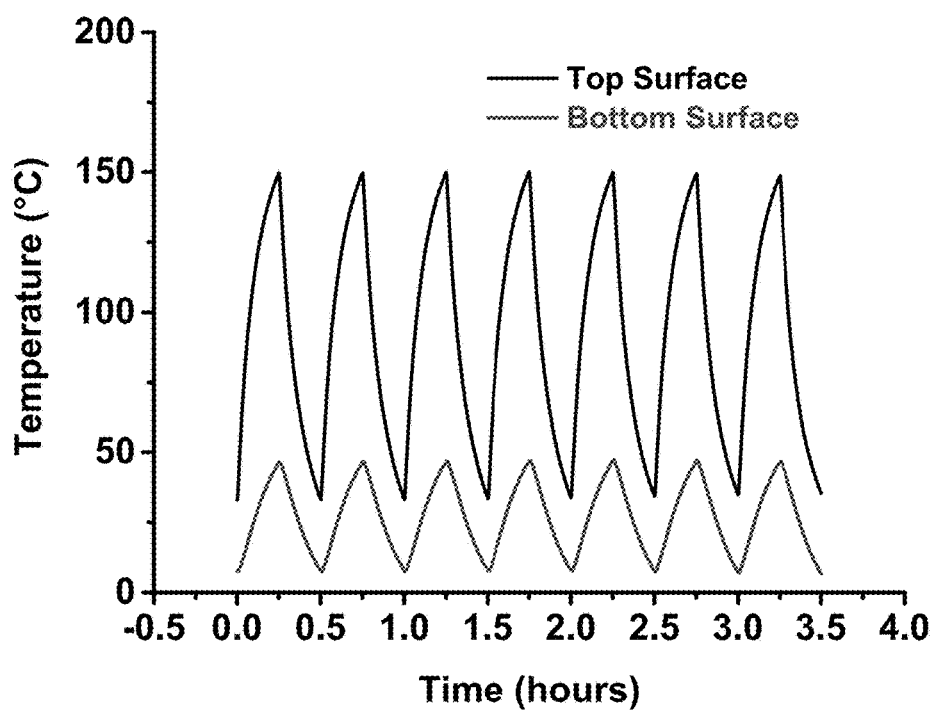

A number of thermal properties, such as thermal conductivity, and the thermal resistance and contact resistance in a bonded configuration, are crucial for TIMs to minimize the overall thermal resistance across interfaces. The thermal conductivity of copper nanowires and the overall thermal resistance of the HPTIM in a fully bonded configuration can both be characterized via the phase-sensitive transient thermo-reflectance (PSTTR) technique, which uses a pump and a probe laser beams on the opposite sides of a sample and enables detection of the heat transfer through multiple layers and interfaces. In the PSTTR, the phase lag between a reference input from the pump laser modulation and the reflected probe laser is measured as a function of the modulation frequency, as shown in view (A) of FIG. 5. By fitting the phase lag-frequency curve using a transient thermal model, the thermal properties of the samples can be extracted.

Only the measurement results for the copper nanowires with φ=45% are shown, because they have a higher thermal conductivity or a lower thermal resistance compared with the copper nanowires with φ=20%. For three samples of copper nanowire arrays with φ=45%, the effective thermal conductivities in the cross-plane direction are measured to be 83.8±34.4 W/m·K., 91.6±37.6 W/m·K, and 97.8±40.1

W/m·K, respectively, which are consistent with the measured thermal conductivity of a single copper nanowire (~220 W/m·K.).

Figure 1:
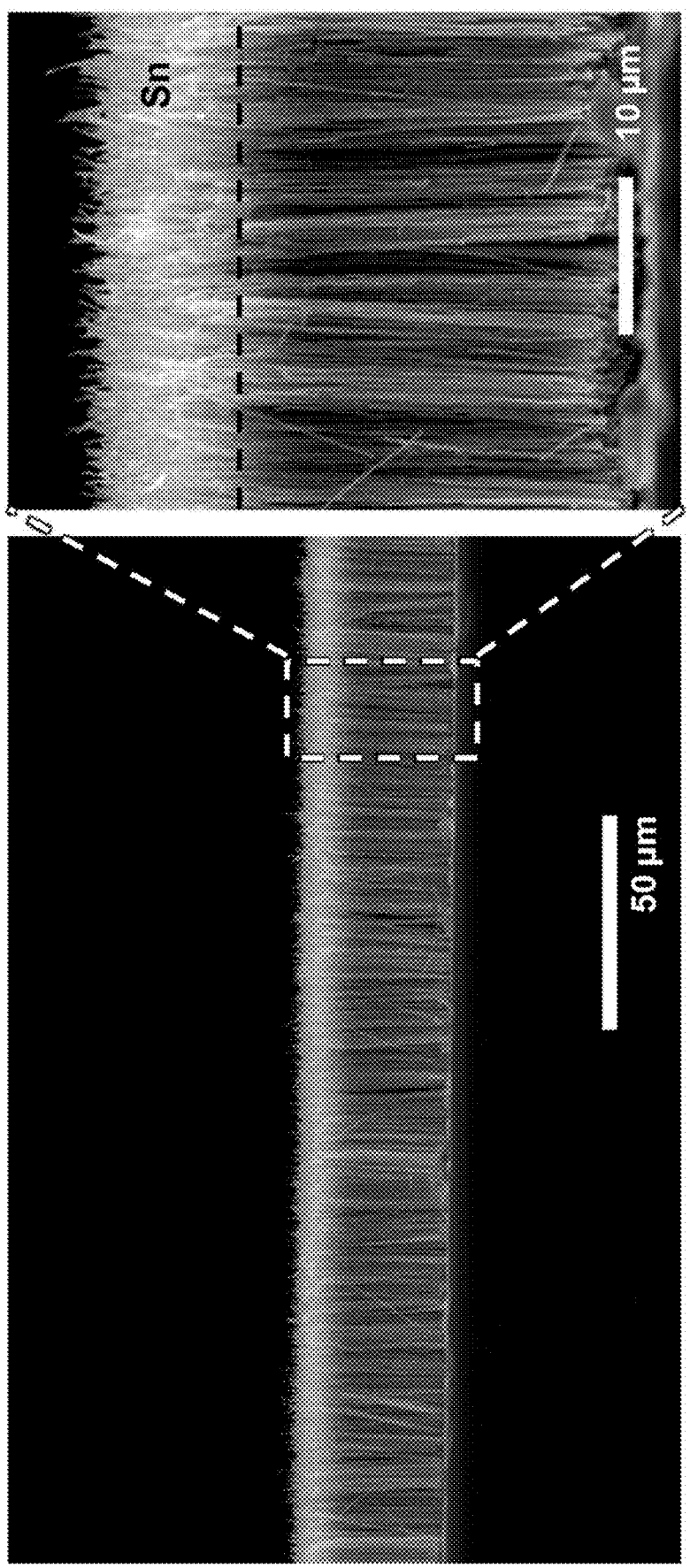
FIG. 1, view (A) is a SEM image of a vertically aligned copper-tin nanowire array for use as a HPTIM showing, in view (B), a darker portion composed of copper and a lighter portion composed of tin.

In a fully bonded configuration, where the HPTIM is employed to bond two silicon substrates, as shown in FIG. 1, their corresponding overall thermal resistances are 0.77±0.17 mm²·K./W, 0.51±0.09 mm²·K./W, and 0.57±0.10 mm²·K/W for complete HPTIM layer thicknesses (including nanowires and solder) of ~24 μm, ~14 μm, and ~27 μm, respectively. The thermal conductivity of copper nanowires (~100 W/m·K) is approximately one order of magnitude larger than common TIMs in literature, and the overall thermal resistance (~0.5 mm²·K/W) of the HPTIM is 2 times better than that of the current state-of-the-art TIMs (~1 mm²·K/W).

The most prominent feature of the HPTIM is its fatigue resistance under thermal cycles, which cause the cumulative fatigue or failure of conventional TIMs. Thermal cycle experiments that evenly included 15-minute heating/cooling periods per cycle were conducted. As shown in view (B) of FIG. 5, two types of samples were tested in which two silicon substrates are bonded by ~20 μm thick HPTIM, in one example, and pure tin (regular solder) in another sample. During thermal cycle tests, constant heat fluxes were maintained across the samples, and thus the total thermal resistance is directly proportional to the temperature difference between the top and the bottom surfaces of the bonded assembly. For a typical HPTIM sample, where >1,280 cycles (or >640 hours) are conducted, as shown in view (B) of FIG. 6, the top and the bottom surface temperatures of the assembly initially oscillate between 144° C. and 34° C., and between 51° C. and 7° C., respectively, in a heating/cooling cycle. Within the first ~200 cycles, the top surface temperature slightly decreases from 144° C. to 139° C., which may be attributed to the improved thermal contacts at local joints of copper nanowires and the tin layer due to the thermal annealing in the heating period.

Figure 6:
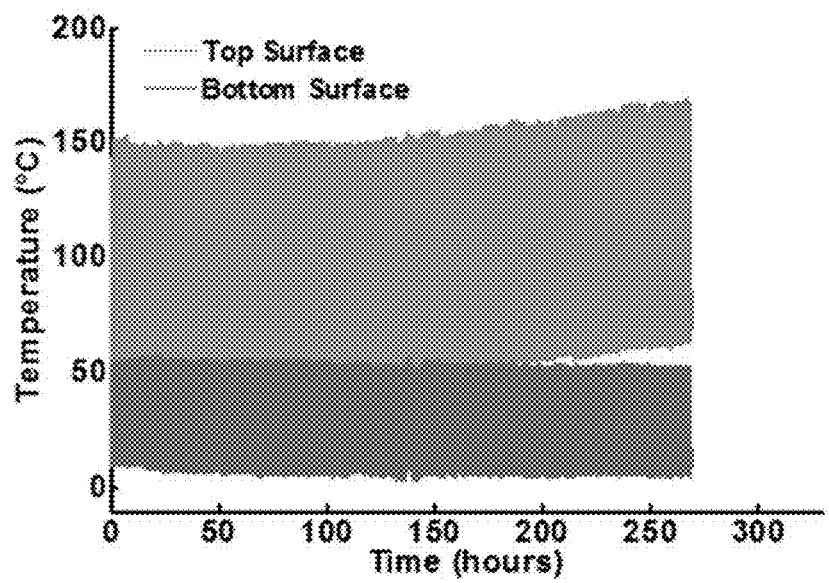
FIG. 6 are time/temperature graphs showing a comparison of the results of a thermal cycling test for a bonded assembly using pure tin, in view (A), and the HPTIM of the present invention in view (B).
Figure 6:
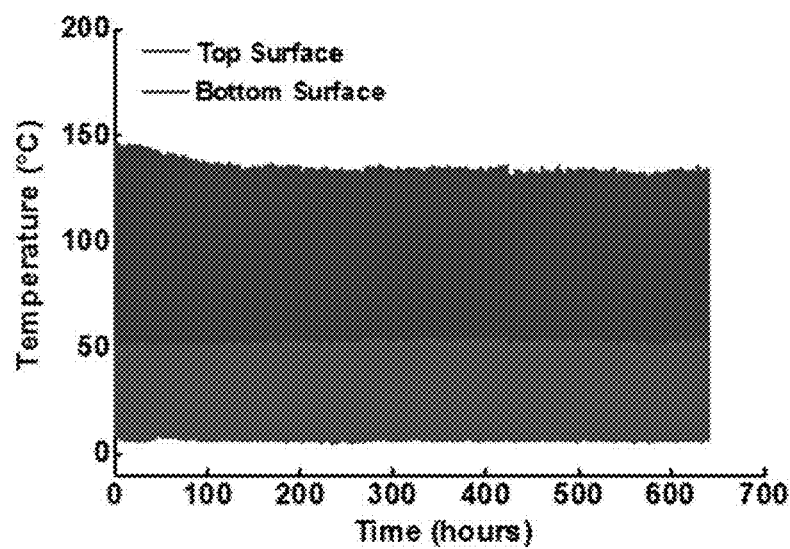

In the remaining >1,080 cycles, the peak temperature difference between the top (red bands in view (B) of FIG. 6) and the bottom (blue bands in view (B) of FIG. 6) surfaces are quite stable through the experiment. For a typical pure tin solder sample, where the top and the bottom surface temperatures of the assembly initially oscillate between 146° C. and 37° C., and between 40° C. and 7° C., respectively, the top surface temperature similarly decreases from 146° C. to 141° C. in the first ~200 cycles. However, in the remaining 1,100 cycles, the measured top surface temperature (pink bands in view (A) of FIG. 6) increases from 141° C. to 169° C., or the peak temperature difference between the top and the bottom assembly surfaces increases from 103° C. to 128° C., which clearly indicates the degradation of the solder. Experimental results demonstrate the high reliability of the HPTIM in a long term as compared to conventional solder TIMs.

Fabrication Process

Figure 7:
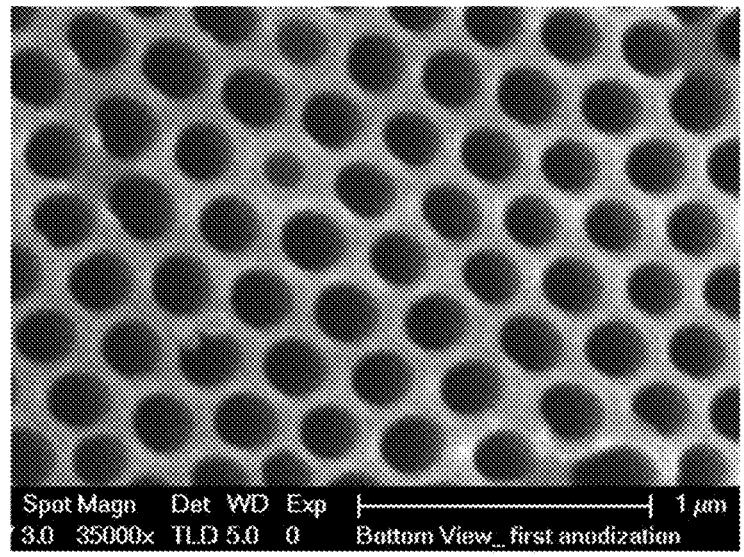
FIG. 7 shows SEM images of large-scale nanoporous templates used to fabricate the vertically aligned nanowires. View (A) shows a template made from anodic aluminum oxide having an ordered organization. View (B) shows a template composed of anodic aluminum oxide, having a disordered organization.
Figure 7:
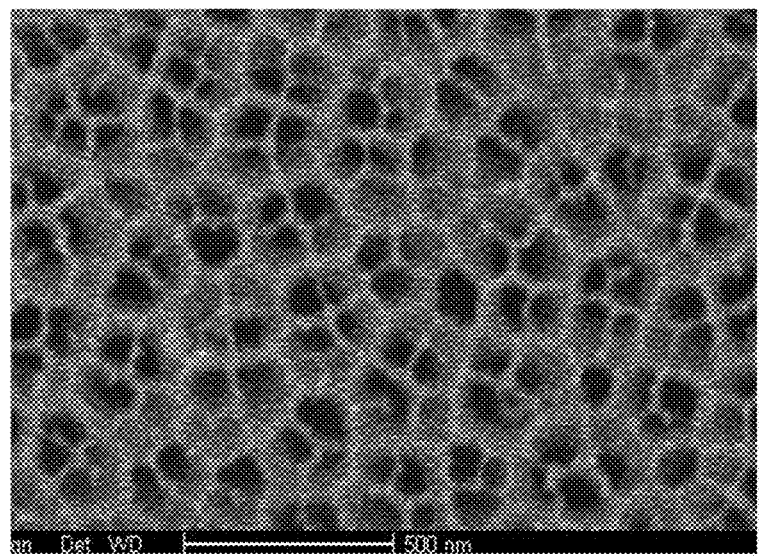

In one embodiment, a thin layer of chromium (10 nm) and a thin layer of copper (100 nm) are sputtered sequentially on a silicon wafer as an adhesion layer and a seed layer, respectively. Alternatively, only a copper seed layer may be applied. A porous anodic alumina (PAA) template composed of anodic aluminum oxide, shown in view (A) of FIG. 7, is then attached on the silicon wafer surface assisted by the capillary force of water. The PAA template is shown having an ordered arrangement of the nanopores.

The silicon wafer having the PAA template attached is put into a copper electroplating bath until the desired height of the copper segment of the nanowires is achieved. The wafer with the template is then put into a tin electroplating bath to apply the tin segment of the nanowires. Square wave-like current is applied in electroplating to reduce the stress. The lengths of the copper and tin segments are controlled by the electroplating time.

After electroplating, the nanowire embedded in the PAA template is patterned and diced to the desired shape and size. Finally, the PAA template is removed by etching in a potassium hydroxide solution. In an alternate embodiment, a polycarbonate template, having a disordered arrangement of nanopores, may be used. Either arrangement of the nanopores (ordered or disordered) may be used, as long as the total area covered by the nanowires does not exceed the desired optimal density.

Bonding Process

The heterogeneous copper-tin nanowire arrays can be bonded with most metal surfaces. The bonding process is in general similar to soldering. Because tin has a melting point of 220° C., the sample must be heated above the melting point and then a compressive force exerted to press the nanowires and the substrate. After the tin is melted and cooled, it will hold the two pieces together. The purpose of the compression is to fix the substrates and provide a better contact (for compensating the surface roughness) during the bonding. The optimal compression force for a 1 cm*1 cm sample is 23-30 N. It corresponds to a pressure of 2.3e5-3.0e5 Pa, however, the force may vary depending on the size of the substrates.

The tips of copper nanowires, when bonding the substrates, can penetrate into the melted tin layer during soldering and be partially embedded in the tin layer after soldering. As a result, the copper nanowires suspended between the two substrates have a uniform length.

One advantage of the heterogeneous copper-tin nanowire array is that it can bond with relatively rough surfaces. In the bonding process, the tips of some heterogeneous nanowires will first contact the "bumps" on a rough surface while other nanowires remain non-contact. With the compression force applied in the bonding process, all the nanowires will finally contact with the rough surface, and the nanowires contacting with the bumps will slightly bend to accommodate to the shape of the rough surface. After the tin segments of the nanowires are melted, the liquid tin will flow freely to fill the gap and form a tight bonding. For surfaces with higher roughness, the heights of the nanowires (both copper and tin segments) can be tuned such that they accommodate the topography of the surface.

By combining compliant and thermally conductive copper nanowires with low melting point tin nanowires, the heterogeneous copper-tin nanowires are capable of dramatically increasing mechanical compliance while maintaining the high thermal conductivities of copper and tin. Experimental results demonstrate mechanical compliance of the vertically aligned copper nanowires in both the cross-plane and the in-plane directions which is comparable with polymers. The excellent thermal conductivity of the copper nanowires leads to an extremely small overall thermal resistance of the HPTIM in a fully bonded HPTIM assembly. The thermal cycling results unambiguously demonstrate the long-term reliability of the HPTIM. The HPTIM can benefit power electronics by allowing them to operate at lower temperatures, or at higher performance with higher power density.

We claim:

1. A thermal interface layer comprising:
   a seed layer of copper; and
   a plurality of nanowires having a copper portion and a tin portion grown on the seed layer, the nanowires having a height;
   wherein the plurality of nanowires cover approximately 30% to 75% of the seed layer; and
   wherein the plurality of nanowires are vertically-aligned from the seed layer to their height.

2. The thermal interface layer of claim 1, the seed layer deposited on a first substrate layer.

3. The thermal interface layer of claim 1 further comprising:
   an adhesion layer of chromium or titanium deposited on a first substrate, the seed layer deposited on the adhesion layer.

4. The thermal interface layer of claim 2, the copper portion of each nanowire comprising 60%-80% of the height of each nanowire, and the tin portion comprising the remaining height of each nanowire.

5. The thermal interface layer of claim 4, the height of each nanowire being in a range between 10 μm and 100 μm.

6. The thermal interface layer of claim 5, each of the plurality of nanowires having an aspect ratio between 100 and 1000.

7. The thermal interface layer of claim 4 wherein:
   the tin portion is bonded with a second substrate layer;
   the second substrate layer is heated above the melting point of tin with a certain pressure applied; and
   the melted tin portion of each nanowire becomes a micron-sized tin particle, the micron-sized tin particles merging into a continuous tin layer in which the continuous tin layer bonds the second substrate with the copper portion of the plurality of nanowires.

8. The thermal interface layer of claim 7 wherein the plurality of vertically aligned nanowires have a filling ratio between the first and second substrates in a range of 30% to 75%.

9. The thermal interface layer of claim 8 wherein the plurality of vertically aligned nanowires have a filling ratio between the first and second substrates of approximately 50%.

10. The thermal layer of claim 7 wherein the Young's modulus of the thermal interface layer is between 200 MPa and 1.5 GPa.

11. The thermal layer of claim 7 wherein the shear modulus of the thermal interface layer is between 2 MPa and 15 MPa.

12. The thermal interface layer of claim 7 wherein the thermal interface layer has a thermal resistance of approximately $0.5 \ mm^2 \cdot KW$.

13. The thermal interface layer of claim 7 wherein the plurality of nanowires are arranged in an ordered arrangement between the first and second substrates.

14. The thermal interface layer of claim 7 wherein the plurality of nanowires are arranged in a disordered arrangement between the first and second substrates.

15. The thermal interface layer of claim 7 wherein the copper portions of the plurality of vertically-aligned nanowires are embedded in the continuous tin layer.

* * * * *